(12) United States Patent
Lee

(10) Patent No.: US 12,399,625 B2
(45) Date of Patent: Aug. 26, 2025

(54) MEMORY DEVICE AND METHOD OF OPERATING THE SAME

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 313 days.

(21) Appl. No.: 18/106,319

(22) Filed: Feb. 6, 2023

(65) Prior Publication Data

US 2024/0069746 A1 Feb. 29, 2024

(30) Foreign Application Priority Data

Aug. 31, 2022 (KR) .......................... 10-2022-0109972

(51) Int. Cl.
 *G06F 3/06* (2006.01)
(52) U.S. Cl.
 CPC .......... *G06F 3/0619* (2013.01); *G06F 3/0629* (2013.01); *G06F 3/0679* (2013.01)
(58) Field of Classification Search
 CPC .... G06F 3/0619; G06F 3/0629; G06F 3/0679; G11C 16/08; G11C 16/26; G11C 16/3427; G11C 16/0483; G11C 16/30; G11C 11/5642; G11C 8/08
 See application file for complete search history.

(56) References Cited

U.S. PATENT DOCUMENTS

| | | | | |
|---|---|---|---|---|
| 2013/0250691 A1* | 9/2013 | Kim | ........................ | G11C 16/26 |
| | | | | 365/185.17 |
| 2013/0294166 A1* | 11/2013 | Ha | ..................... | G11C 16/0483 |
| | | | | 365/185.17 |
| 2015/0364185 A1* | 12/2015 | Yoo | ..................... | G11C 11/5635 |
| | | | | 365/185.03 |
| 2021/0383875 A1* | 12/2021 | Lee | ........................ | G11C 29/00 |
| 2022/0101923 A1* | 3/2022 | Park | ........................ | G11C 16/10 |

FOREIGN PATENT DOCUMENTS

| | | |
|---|---|---|
| KR | 101784973 B1 | 10/2017 |
| KR | 1020180003197 A | 1/2018 |
| KR | 1020200050762 A | 5/2020 |
| KR | 1020220031466 A | 3/2022 |

\* cited by examiner

*Primary Examiner* — Hiep T Nguyen
(74) *Attorney, Agent, or Firm* — WILLIAM PARK & ASSOCIATES LTD.

(57) ABSTRACT

The present disclosure relates to a memory device, and a method of operating the memory device that includes a memory block including memory cells. The memory device also includes a voltage generator configured to apply a read voltage and pass voltages to word lines coupled to the memory block. The voltage generator is configured to apply the read voltage to a selected word line among the word lines and apply different pass voltages to unselected word lines symmetrical to each other with respect to the selected word line depending on distances to the selected word line, during a read operation on the memory block.

19 Claims, 17 Drawing Sheets

(2Vpass ≤ 4Vpass < 3Vpass < 1Vpass)

(2Vpass ≤ 4Vpass < 3Vpass < 1Vpass)

(2Vpass ≤ 4Vpass < 3Vpass < 1Vpass)

(2Vpass ≤ 4Vpass < 3Vpass < 1Vpass)

(2Vpass < 3Vpass < 1Vpass)

(2Vpass ≤ 4Vpass < 3Vpass < 1Vpass)

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0109972, filed on Aug. 31, 2022, in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly to a memory device configured to perform a read operation and a method of operating the memory device.

2. Related Art

A memory device may include a memory cell array in which data is stored, a peripheral circuit configured to perform a program operation, a read operation, or an erase operation, and a control logic configured to control the peripheral circuit.

The memory cell array may include a plurality of memory blocks, each of which may include a plurality of strings. Each of the strings may include memory cells. In a memory device formed in a three-dimensional (3D) structure, strings may extend in a vertical direction from a substrate. Therefore, the memory cells may be stacked in a vertical direction on the substrate.

During a read operation on selected strings included in a selected memory block, a read voltage may be applied to a selected word line, and a pass voltage may be applied to unselected word lines. Because the selected word line and the unselected word lines are also coupled to unselected strings, the same voltages as voltages applied to word lines coupled to the selected strings may be applied to word lines of the unselected strings. In the selected strings, channels are coupled to a ground terminal, whereas, in the unselected strings, channels may float. Due thereto, pinch-off in which the channels are disconnected may occur in memory cells having a relatively low threshold voltage, among memory cells included in the unselected strings. When the difference between the voltages of adjacent channels occurs in the area in which pinch-off occurs, hot electrons may be generated. The generation of the hot electrons may increase the threshold voltages of memory cells, and thus the reliability of the read operation of the memory device may be degraded.

SUMMARY

Various embodiments of the present disclosure are directed to a memory device capable of improving the reliability of a read operation and a method of operating the memory device.

A memory device according to an embodiment of the present disclosure may include a memory block including memory cells. The memory device may also include a voltage generator configured to apply a read voltage and pass voltages to word lines coupled to the memory block. The voltage generator may be configured to apply the read voltage to a selected word line among the word lines, and apply different pass voltages to unselected word lines symmetrical to each other with respect to the selected word line depending on distances to the selected word line, during a read operation on the memory block.

A method of operating a memory device according to the present disclosure may include applying a read voltage to a selected word line and applying a first pass voltage to first unselected word lines adjacent to the selected word line. The method may also include applying a second pass voltage, lower than the first pass voltage, to second unselected word lines adjacent to the first unselected word lines. The method may further include applying a third pass voltage having a level between the first and second pass voltages to third unselected word lines adjacent to the second unselected word lines.

DETAILED DESCRIPTION

Specific structural or functional descriptions, disclosed herein, are exemplified to describe embodiments according to the concept of the present disclosure. The embodiments according to the concept of the present disclosure should not be construed as being limited to embodiments described below, and may be modified in various forms and replaced with other equivalent embodiments.

Hereinafter, it will be understood that, although the terms "first" and "second" may be used herein to describe various elements, these elements should not be limited by these terms. The terms are used to distinguish one element from other elements and not to imply a number or order of elements.

Figure 1:
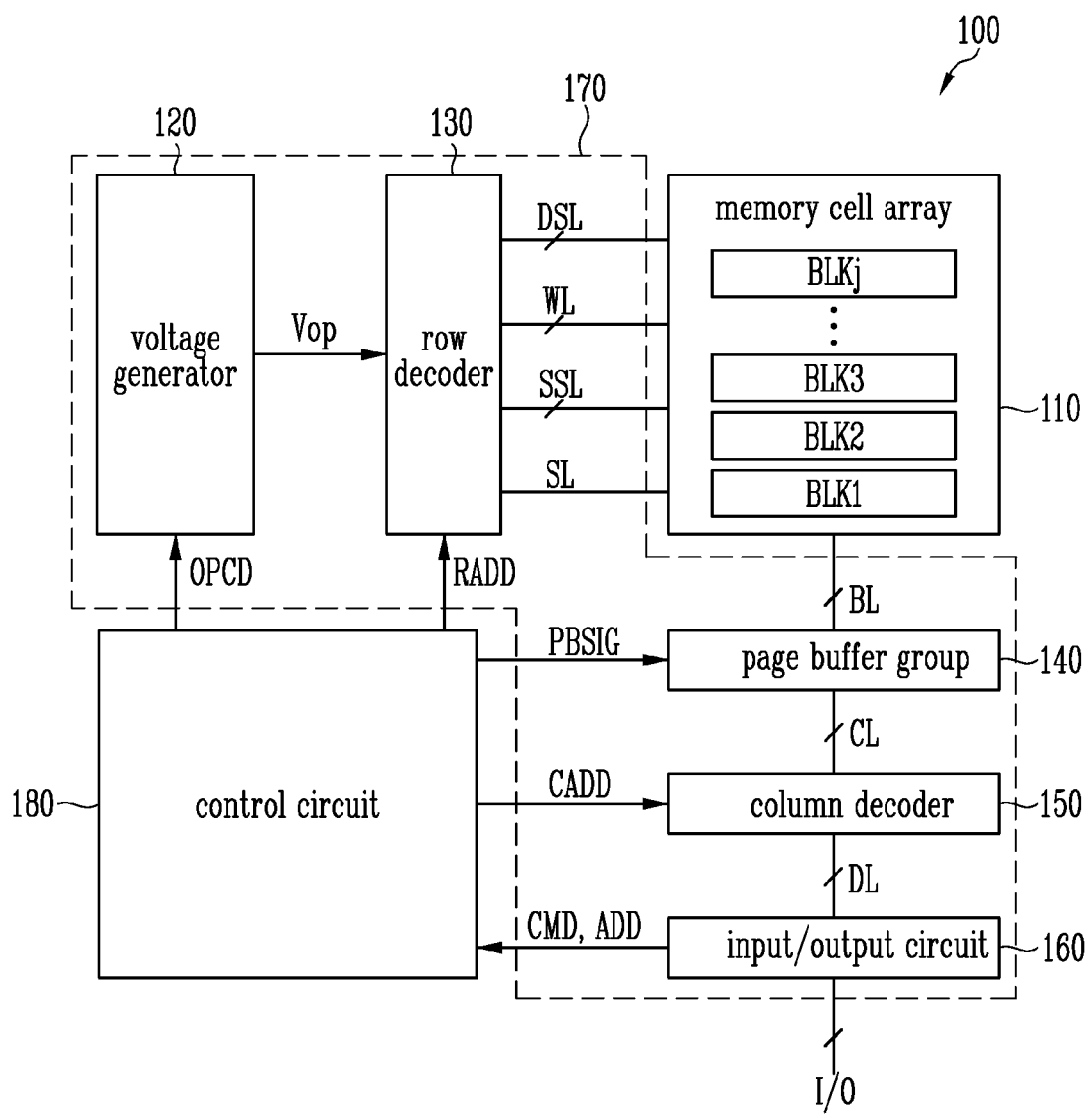
FIG. 1 is a diagram illustrating a memory device.

FIG. 1 is a diagram illustrating a memory device.

Referring to FIG. 1, a memory device 100 may include a memory cell array 110, a peripheral circuit 170, and a control circuit 180.

The memory cell array 110 may include first to j-th memory blocks BLK1 to BLKj. The first to j-th memory blocks BLK1 to BLKj may be formed in a three-dimensional (3D) structure. Each of the first to j-th memory blocks BLK1 to BLKj formed in the 3D structure may include memory cells stacked in a vertical direction on a substrate.

According to a program scheme, each memory cell may store one bit of data or two bits of data. A scheme for storing one bit of data in one memory cell is referred to as a single-level cell (SLC) scheme, and a scheme for storing two bits of data in one memory cell is referred to as a multi-level cell (MLC) scheme. A scheme in which three bits of data are stored in one memory cell is referred to as a triple-level cell (TLC) scheme, and a scheme in which four bits of data are stored in one memory cell is referred to as a quad-level cell (QLC) scheme. In addition, five or more bits of data may be stored in one memory cell.

The peripheral circuit 170 may perform a program operation of storing data in the memory cell array 110, a read operation of outputting data stored in the memory cell array 110, and an erase operation of erasing data stored in the memory cell array 110. For example, the peripheral circuit 170 may include a voltage generator 120, a row decoder 130, a page buffer group 140, a column decoder 150, and an input/output circuit 160.

The voltage generator 120 may generate various operating voltages Vop required for a program operation, a read operation, or an erase operation in response to an operation code OPCD. For example, the voltage generator 120 may generate program voltages, pass voltages, turn-on voltages, turn-off voltages, a ground voltage, negative voltages, source voltages, verify voltages, read voltages, erase voltages, a precharge voltage, etc. in response to the operation code OPCD.

The program voltages may be voltages that are applied to a selected word line, among the word lines WL, during a program operation, and may be used to increase the threshold voltages of memory cells coupled to the selected word line.

The pass voltages may be voltages that are applied to unselected word lines, among the word lines WL, during a program or read operation, and may be used to turn on memory cells coupled to the unselected word lines. According to the present embodiment, during a read operation, the voltage generator 120 may control the levels of the pass voltages depending on the location of the selected word line. For example, the voltage generator 120 may control the levels of pass voltages to be applied to first to third unselected word lines or first to fourth unselected word lines, which are sequentially adjacent to the selected word line, differently depending on the distances to the selected word line.

The turn-on voltages may be voltages that are applied to a drain selection line DSL or a source selection line SSL, and may be used to turn on drain selection transistors or source selection transistors. The turn-off voltages may be voltages that are applied to the drain selection line DSL or the source selection line SSL, and may be used to turn off the drain selection transistors or the source selection transistors. The ground voltage may be a voltage of 0 V. The negative voltages may be voltages lower than 0 V. The source voltages may be voltages that are applied to a source line SL and may be negative voltages, the ground voltage, or positive voltages. The verify voltages may be voltages required for determining the threshold voltages of selected memory cells during a program operation or an erase operation, and may be applied to a selected word line or all word lines coupled to a selected memory block. The read voltages may be voltages that are applied to the selected word line during a read operation, and may be used to determine data stored in memory cells. The erase voltages may be voltages that are applied to the source line SL during an erase operation, and may be used to decrease the threshold voltages of memory cells. The precharge voltage may be a positive voltage for precharging the channel of unselected strings during a verify operation or a read operation, and may be supplied to the source line SL.

The row decoder 130 may be coupled to the voltage generator 120 through global lines, and may be coupled to the first to j-th memory blocks BLK1 to BLKj through the drain selection lines DSL, the word lines WL, the source selection lines SSL, and the source line SL. The row decoder 130 may transfer the operating voltages Vop to the drain selection lines DSL, the word lines WL, the source selection lines SSL, and the source line SL, which are coupled to a memory block selected in response to a row address RADD.

The page buffer group 140 may include page buffers (not illustrated) coupled in common to the first to j-th memory blocks BLK1 to BLKj. For example, each of the page buffers may be coupled to the first to j-th memory blocks BLK1 to BLKj through bit lines BL. The page buffers may sense the currents or voltages of the bit lines BL in response to page buffer control signals PBSIG.

The column decoder 150 may transfer data between the page buffer group 140 and the input/output circuit 160 in response to a column address CADD. For example, the column decoder 150 may be coupled to the page buffer group 140 through column lines CL, and may be coupled to the input/output circuit 160 through data lines DL.

The input/output circuit 160 may receive/output a command CMD, an address ADD, or data through input/output lines I/O. For example, the input/output circuit 160 may transmit the command CMD and the address ADD, received from an external controller through the input/output lines I/O, to the control circuit 180, and may transmit the data DATA, received from the external controller through the input/output lines I/O, to the column decoder 150. Alternatively, the input/output circuit 160 may output data, received from the column decoder 150, to the external controller through the input/output lines I/O.

The control circuit 180 may output the operation code OPCD, the row address RADD, the page buffer control signals PBSIG, and the column address CADD in response to the command CMD and the address ADD. For example, when the command CMD input to the control circuit 180 is a command corresponding to a program operation, the control circuit 180 may control the peripheral circuit 170 so that a program operation is performed on a memory block selected by the address ADD. When the command CMD input to the control circuit 180 is a command corresponding to a read operation, the control circuit 180 may control the peripheral circuit 170 so that a read operation is performed on a memory block selected by the address and read data is output. When the command CMD input to the control circuit 180 is a command corresponding to an erase operation, the control circuit 180 may control the peripheral circuit 170 so that an erase operation is performed on a selected memory block.

Figure 2:
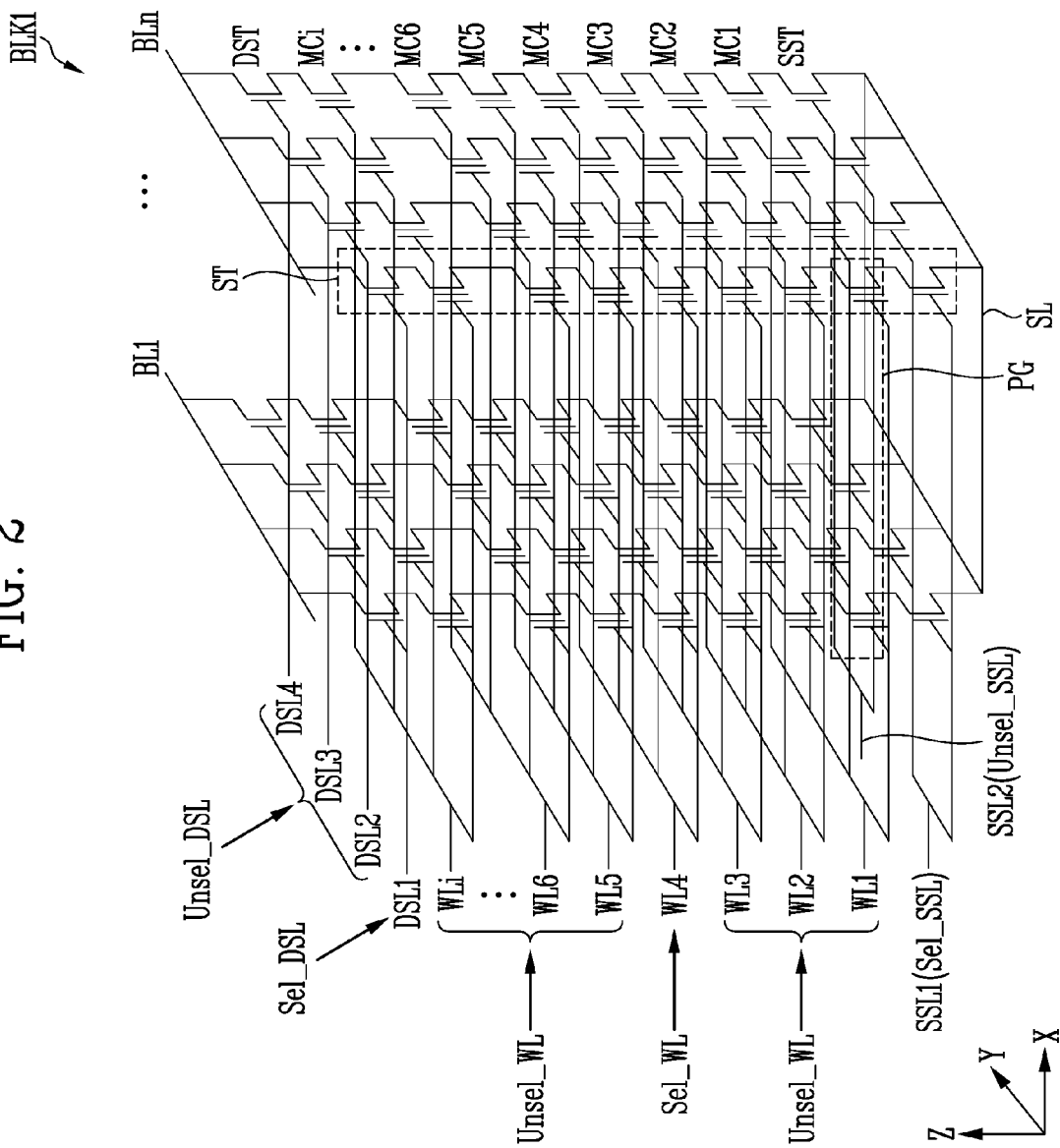
FIG. 2 is a circuit diagram illustrating any one memory block illustrated in FIG. 1.

FIG. 2 is a circuit diagram illustrating any one memory block illustrated in FIG. 1.

Referring to FIG. 2, the first memory block BLK1 may include strings ST coupled between first to n-th bit lines BL1 to BLn and a source line SL. Because the first to n-th bit lines BL1 to BLn extend along a Y direction and are spaced apart from each other along an X direction, the strings ST may extend along a Z direction, and may be spaced from each other in the X and Y directions.

Any one string ST, among the strings ST coupled to the n-th bit line BLn, will be described in detail by way of example. That is, the string ST may include a source selection transistor SST, first to i-th memory cells MC1 to MCi, and a drain selection transistor DST. Because the first memory block BLK1 illustrated in FIG. 2 schematically illustrates the structure of the memory block, the number of source selection transistors SST, first to i-th memory cells MC1 to MCi, and drain selection transistors DST, included in each string ST, may be changed according to the memory device. Further, although not illustrated in the drawing, the strings ST may further include dummy cells for improving the electrical characteristics of the memory cells. The dummy cells may store dummy data instead of normal data.

Gates of the source selection transistors SST included in different strings ST may be coupled to first and second source selection lines SSL1 and SSL2, gates of the first to i-th memory cells MC1 to MCi may be coupled to first to i-th word lines WL1 to WLi, and gates of the drain selection transistors DST may be coupled to first to fourth drain selection lines DSL1 to DSL4.

Memory cells formed on the same layer, among the first to i-th memory cells MC1 to MCi, may be coupled to the same word line. For example, the first memory cells MC1 included in different strings ST may be coupled in common to the first word line WL1, and the i-th memory cells MCi included in different strings ST may be coupled in common to the i-th word line WLi. A group of memory cells that are included in different strings ST and coupled to the same word line may be a page (PG). A program or read operation may be performed on a page (PG) basis, and an erase operation may be performed on a memory block basis.

During a program or read operation, a page may be selected by the drain selection line, the source selection line, and the word line. For example, it is assumed that, among drain selection lines coupled to the first memory block BLK1, the first drain selection line DSL1 is a selected drain selection line Sel_DSL, and the fourth word line WL4 is a selected word line Sel_WL. The remaining drain selection lines, that is, the second to fourth drain selection lines DSL2 to DSL4, other than the first drain selection line DSL1, may be unselected drain selection lines Unsel_DSL, and the remaining word lines, that is, the first to third word lines WL1 to WL3 and the fifth to i-th word lines WL5 to WLi, other than the fourth word line WL4, may be unselected word lines Unsel_WL. The first source selection line SSL1, coupled to the strings selected by the selected drain selection line Sel_DSL, may be a selected source selection line Sel_SSL, and the second source selection line SSL2 may be an unselected source selection line Unsel_SSL.

During a program or read operation, a turn-on voltage may be applied to the selected drain selection line Sel_DSL and to the selected source selection line Sel_SSL. A turn-off voltage may be applied to the unselected drain selection lines Unsel_DSL and to the unselected source selection lines Unsel_SSL. A program voltage or a read voltage may be applied to the selected word line Sel_WL, and pass voltages may be applied to the unselected word lines Unsel_WL.

Figure 3:
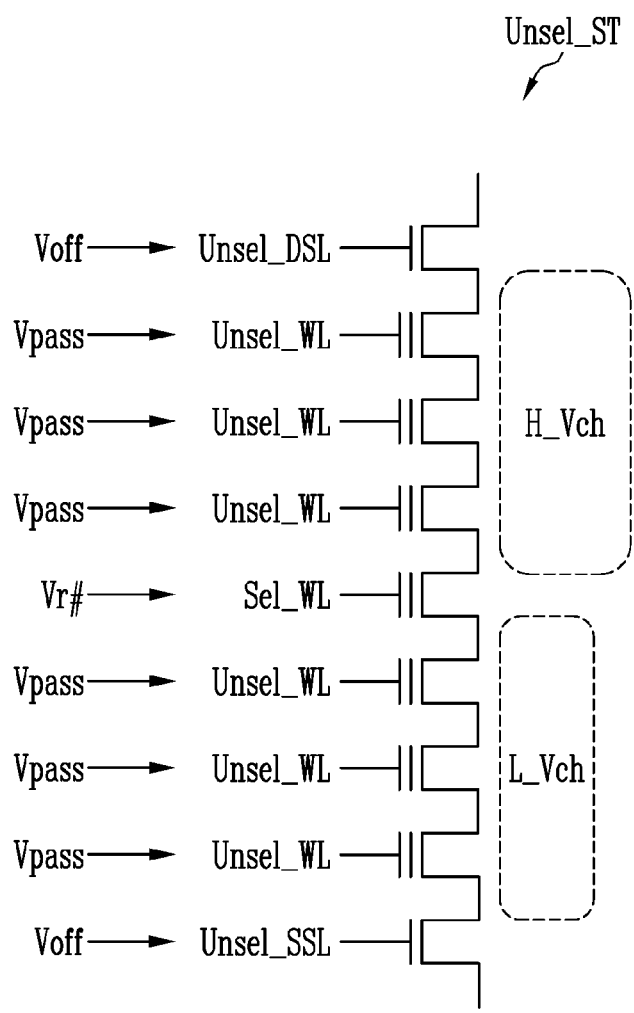
FIG. 3 is a diagram illustrating channel voltages of an unselected string during a read operation.

FIG. 3 is a diagram illustrating channel voltages of an unselected string during a read operation.

Referring to FIG. 3, when a read operation is performed on a selected string, a turn-off voltage Voff is applied to an unselected drain selection line Unsel_DSL and an unselected source selection line Unsel_SSL that are coupled to an unselected string Unsel_ST, and thus the channel of the unselected string Unsel_ST may float. When the same pass voltage Vpass is applied to unselected word lines Unsel_WL and a read voltage Vr #is applied to a selected word line Sel_WL, a channel voltage Vch may increase due to coupling between the word lines and channels. For example, the read voltage Vr #may be set to a voltage lower than the pass voltage Vpass, and the pass voltage Vpass may be set to a level at which the unselected memory cells may be turned on. In this way, because the pass voltage Vpass is set to a high level, coupling occurs in the channel of the unselected string Unsel_ST, thus increasing the channel voltage Vch. In this case, when the read voltage Vr #applied to the selected word line Sel_WL is a relatively low voltage, among the read voltages, pinch-off in which a channel is disconnected in a memory cell coupled to the selected word line Sel_WL may occur. In this case, a difference in the channel voltage Vch may occur with respect to an area in which the channel is disconnected. For example, the channel may be separated into an area for a high channel voltage H_Vch and an area for a low channel voltage L_Vch, whereby hot electrons may be generated due to the difference between the channel voltages. During a read operation, when hot electrons flow into the memory cells, the threshold voltages of the memory cells may increase. Pinch-off may also occur in memory cells coupled to unselected word lines Unsel_WL in addition to memory cells coupled to the selected word line Sel_WL.

Figure 4:
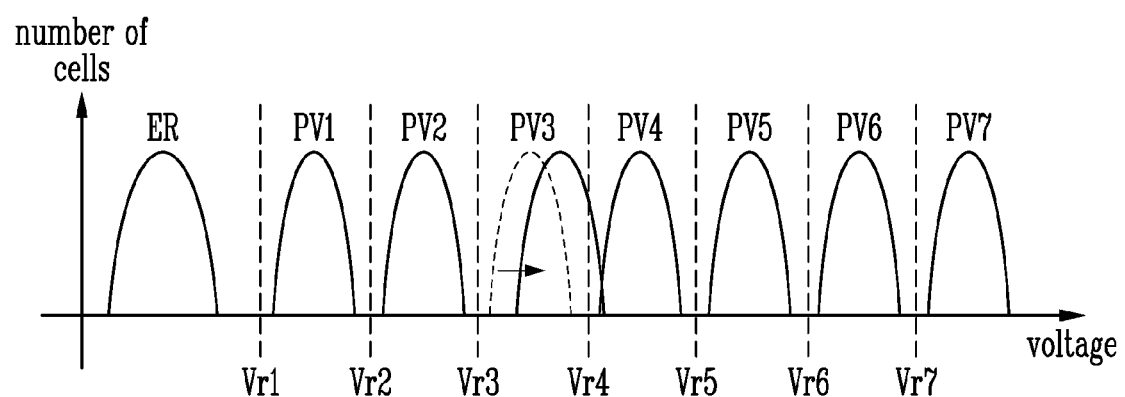
FIG. 4 is a diagram illustrating threshold voltages of memory cells included in unselected strings during a read operation.

FIG. 4 is a diagram illustrating threshold voltages of memory cells included in unselected strings during a read operation.

Referring to FIGS. 4 and 3, each of memory cells programmed in a triple-level cell scheme may enter an erased state ER or any one of first to seventh program states PV1 to PV7 depending on the levels of threshold voltages. During a read operation on the memory cells programmed in the triple-level cell scheme, first to seventh read voltages Vr1 to Vr7 may be used to determine the states of the memory cells. As described above with reference to FIG. 3, when the difference between channel voltages occurs and threshold voltages of some memory cells increase during a read operation, the reliability of data that is read using a selected read voltage may be degraded. For example, when the threshold voltages of some memory cells programmed to a third program state PV3 increase during a read operation, some memory cells to be read in the third program state PV3 in a read operation that uses a fourth read voltage Vr4 may be read in the fourth program state PV4.

In the present embodiment, pass voltages that are applied to unselected word lines may be controlled to prevent such read errors as indicated above.

Figure 5:
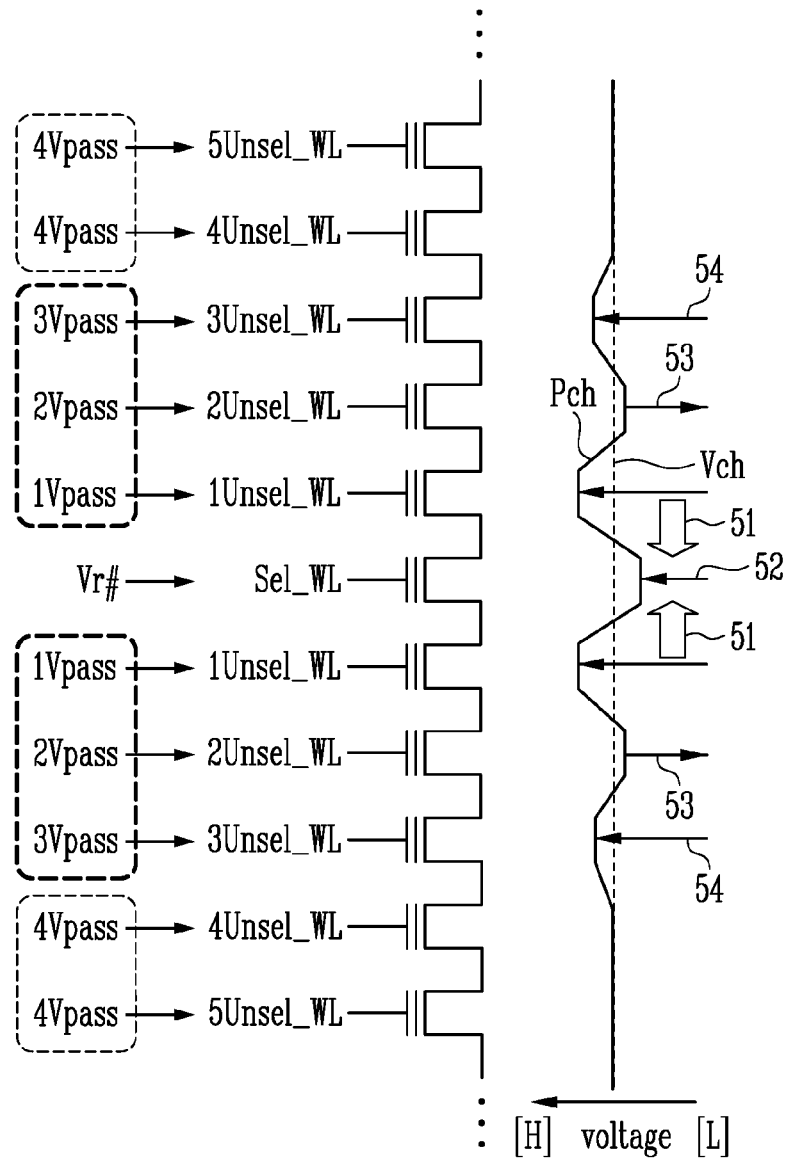
FIG. 5 is a diagram illustrating a read operation according to a first embodiment of the present disclosure.

FIG. 5 is a diagram illustrating a read operation according to a first embodiment of the present disclosure.

Referring to FIG. 5, a first pass voltage 1Vpass, which is the highest voltage among pass voltages, may be applied to first unselected word lines 1Unsel_WL adjacent to a selected word line Sel_WL above and below the selected word line, a second pass voltage 2Vpass, which is a lowest pass voltage among the pass voltages, may be applied to second unselected word lines 2Unsel_WL adjacent to the first unselected word lines 1Unsel_WL, and a third pass voltage 3Vpass between the first and second pass voltages 1Vpass and 2Vpass may be applied to third unselected word lines 3Unsel_WL adjacent to the second unselected word lines 2Unsel_WL. A fourth pass voltage 4Vpass may be applied to the remaining unselected word lines 4Unsel_WL, 5Unsel_WL, . . . . The fourth pass voltage 4Vpass may be set to a voltage that is lower than the third pass voltage 3Vpass and equal to or higher than the second pass voltage 2Vpass. Functions of the pass voltages that are applied to the first to third unselected word lines 1Unsel_WL to 3Unsel_WL adjacent to the selected word line Sel_WL are described below.

The first pass voltage 1Vpass may be set to the highest voltage to prevent the channel potential Pch of an area corresponding to the selected word line Sel_WL from decreasing due to a read voltage Vr #(51). Therefore, the channel potential Pch attributable to the read voltage Vr #applied to the selected word line Sel_WL may increase (52). Due thereto, pinch-off that may occur in an area corresponding to the selected word line Sel_WL may be suppressed.

The second pass voltage 2Vpass may be set to the lowest voltage to prevent the channel potential Pch from increasing due to the first pass voltage 1Vpass (53). The third pass voltage 3Vpass may be set to a voltage that is higher than the second pass voltage 2Vpass and lower than the first pass voltage 1Vpass to prevent the channel potential Pch from decreasing due to the second pass voltage 2Vpass (54).

Although the fourth pass voltage 4Vpass may be uniformly applied to the remaining unselected word lines including the fourth unselected word lines 4Unsel_WL, different pass voltages between which differences are gradually decreased as in the case of the first to third pass voltages 1Vpass to 3Vpass may be alternately applied thereto.

As described above, the channel potentials Pch may be controlled by the pass voltages 1Vpass, 2Vpass, 3Vpass, . . . , applied to the unselected word lines 1Unsel_WL, 2Unsel_WL, 3Unsel_WL, . . . , whereby the channel voltages Vch of the unselected strings may have a uniform level.

Figure 6A:
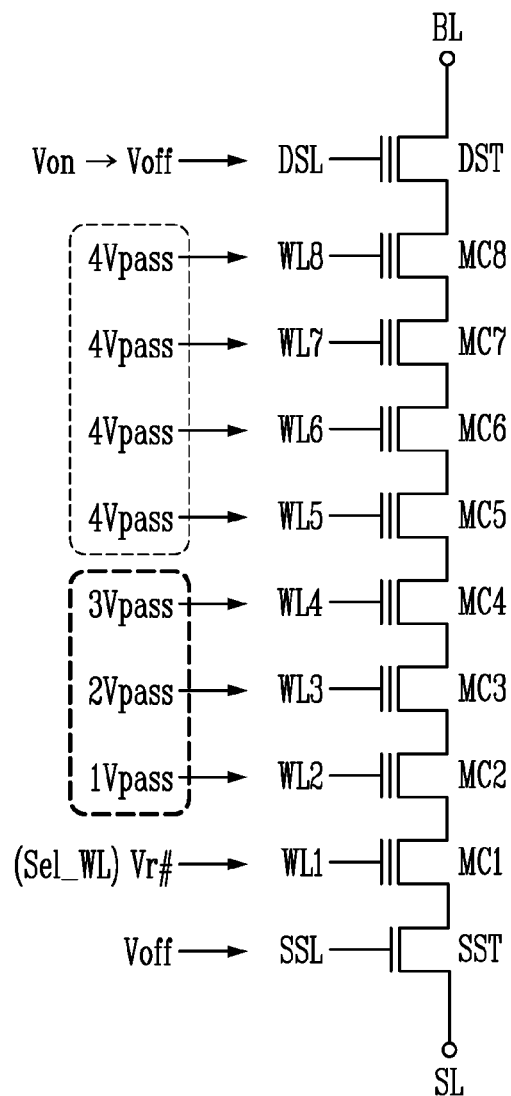
FIGS. 6A to 6C are diagrams illustrating pass voltages applied to unselected word lines depending on a selected word line.
Figure 6B:
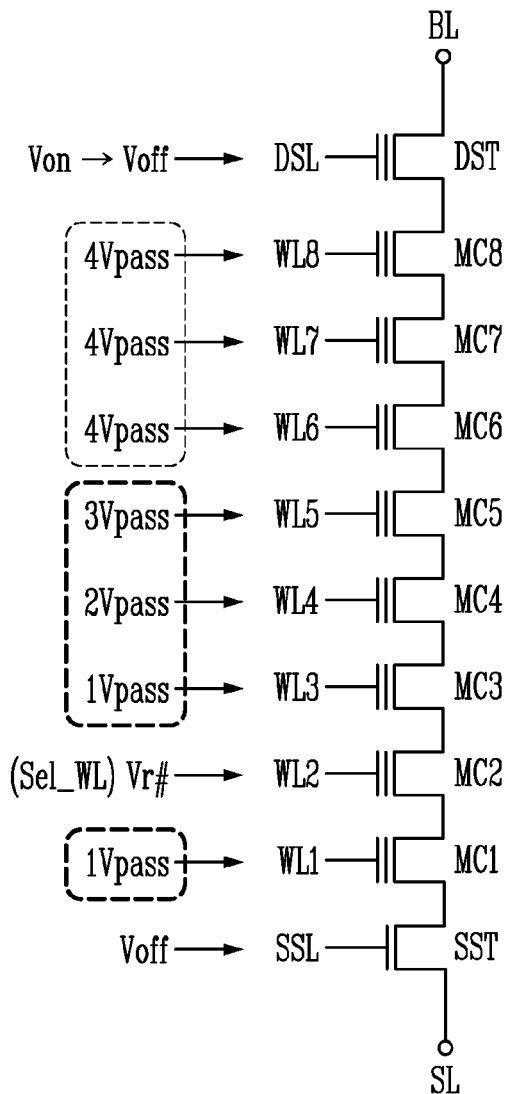
Figure 6C:
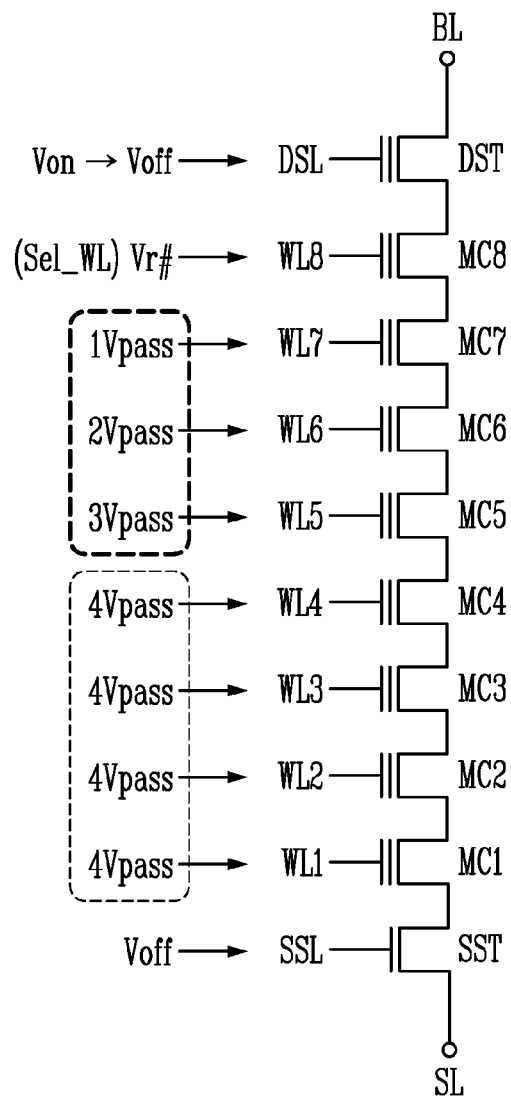

FIGS. 6A to 6C are diagrams illustrating pass voltages that are applied to unselected word lines depending on a selected word line.

Referring to FIG. 6A, when a selected word line Sel_WL is a first word line WL1 adjacent to a source selection line SSL, voltages that are applied to word lines are described as follows.

A read voltage Vr #may be applied to the first word line WL1, which is the selected word line Sel_WL, and a first pass voltage 1Vpass, which is the highest voltage, may be applied to a second word line WL2 adjacent to the first word line WL1. A second pass voltage 2Vpass, which is the lowest voltage, may be applied to a third word line WL3 adjacent to the second word line WL2, and a third pass voltage 3Vpass between the first and second pass voltages 1Vpass and 2Vpass may be applied to a fourth word line WL4 adjacent to the third word line WL3. A fourth pass voltage 4Vpass may be applied to the remaining unselected word lines, that is, fifth to eighth word lines WL5 to WL8. After a turn-on voltage Von is applied to a drain selection line DSL, a turn-off voltage Voff may be applied. The turn-off voltage Voff may be applied to a source selection line SSL.

Referring to FIG. 6B, when the selected word line Sel_WL is a second word line WL2, voltages that are applied to word lines are described as follows.

A read voltage Vr #may be applied to the second word line WL2, which is the selected word line Sel_WL, and a first pass voltage 1Vpass, which is the highest voltage, may be applied to first and third word lines WL1 and WL3 adjacent to the second word line WL2 above and below the second word line WL2. A second pass voltage 2Vpass, which is the lowest voltage, may be applied to a fourth word line WL4 adjacent to the third word line WL3, and a third pass voltage 3Vpass between the first and second pass voltages 1Vpass and 2Vpass may be applied to a fifth word line WL5 adjacent to the fourth word line WL4. A fourth pass voltage 4Vpass may be applied to the remaining unselected word lines, that is, sixth to eighth word lines WL6 to WL8. After a turn-on voltage Von is applied to a drain selection line DSL, a turn-off voltage Voff may be applied. The turn-off voltage Voff may be applied to a source selection line SSL.

Referring to FIG. 6C, when the selected word line Sel_WL is an eighth word line WL8 adjacent to a drain selection line DSL, voltages that are applied to word lines are described as follows.

A read voltage Vr #may be applied to the eighth word line WL8, which is the selected word line Sel_WL, and a first pass voltage 1Vpass, which is the highest voltage, may be applied to a seventh word line WL7 adjacent to the eighth word line WL8. A second pass voltage 2Vpass, which is the lowest voltage, may be applied to a sixth word line WL6 adjacent to the seventh word line WL7, and a third pass voltage 3Vpass between the first and second pass voltages 1Vpass and 2Vpass may be applied to a fifth word line WL5 adjacent to the sixth word line WL6. A fourth pass voltage 4Vpass may be applied to the remaining unselected word lines, that is, fourth to first word lines WL4 to WL1. After a turn-on voltage Von is applied to a drain selection line DSL, a turn-off voltage Voff may be applied. The turn-off voltage Voff may be applied to a source selection line SSL.

Figure 7:
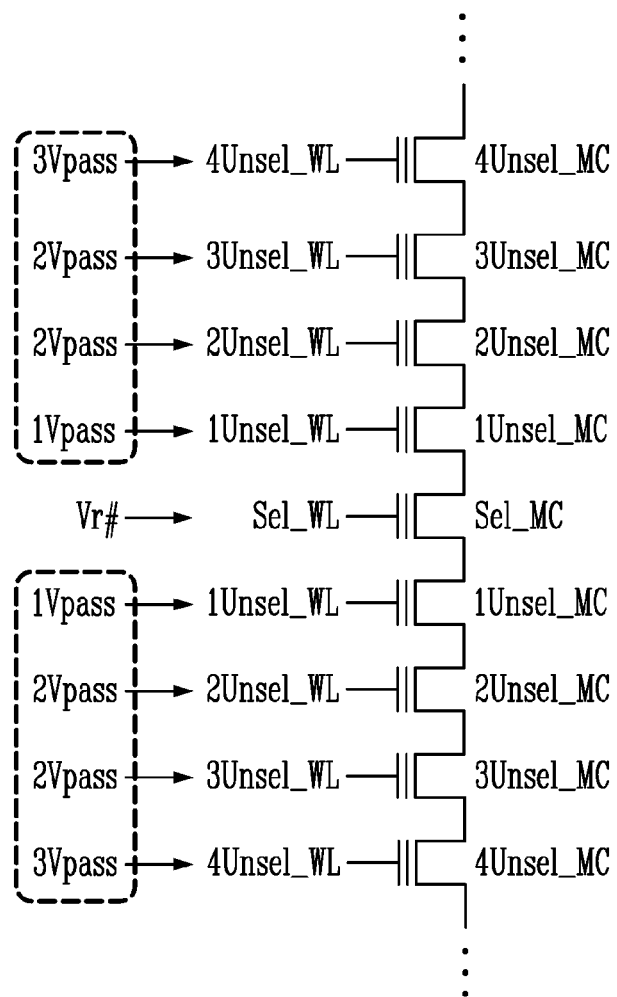
FIG. 7 is a diagram illustrating a read operation according to a second embodiment of the present disclosure.

FIG. 7 is a diagram illustrating a read operation according to a second embodiment of the present disclosure.

Referring to FIG. 7, a second pass voltage 2Vpass may be applied in common to second and third unselected word lines 2Unsel_WL and 3Unsel_WL. For example, a read voltage Vr #may be applied to a selected word line Sel_WL, and a first pass voltage 1Vpass, which is the highest pass voltage, may be applied to first unselected word lines 1Unsel_WL adjacent to the selected word line Sel_WL. The second pass voltage 2Vpass, which is the lowest pass voltage, may be applied to second unselected word lines 2Unsel_WL adjacent to the first unselected word lines 1Unsel_WL, respectively, and the second pass voltage 2Vpass may also be applied to the third unselected word lines 3Unsel_WL adjacent to the second unselected word lines 2Unsel_WL, respectively. A third pass voltage 3Vpass between the first and second pass voltages 1Vpass and 2Vpass may be applied to fourth unselected word lines 4Unsel_WL adjacent to the third unselected word lines 3Unsel_WL, respectively.

Figure 8:
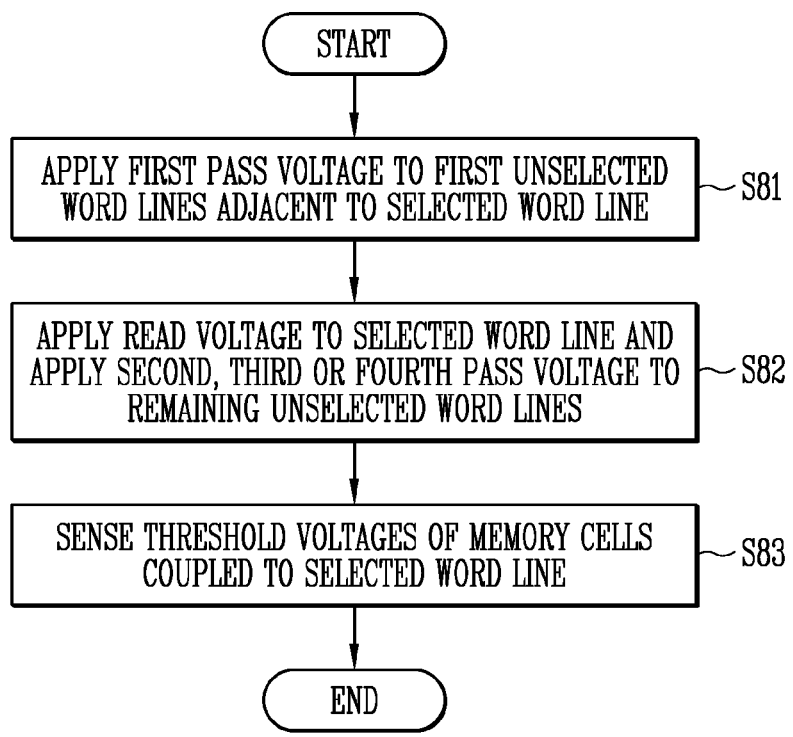
FIG. 8 is a flowchart illustrating a read operation according to a third embodiment of the present disclosure.

FIG. 8 is a flowchart illustrating a read operation according to a third embodiment of the present disclosure.

Referring to FIG. 8, in the read operation according to the third embodiment, the time during which a first pass voltage is applied to first unselected word lines may be adjusted. For example, the first pass voltage may be applied to the first unselected word lines adjacent to a selected word line at step S81. Here, the remaining unselected word lines, other than the first unselected word lines, and the selected word line may float.

After the first pass voltage is applied to the first unselected word lines at step S81, a read voltage may be applied to the selected word line, and a second, third or fourth pass voltage may be applied to the remaining unselected word lines at step S82.

Then, threshold voltages of the memory cells coupled to the selected word line may be sensed at step S83.

Figure 9:
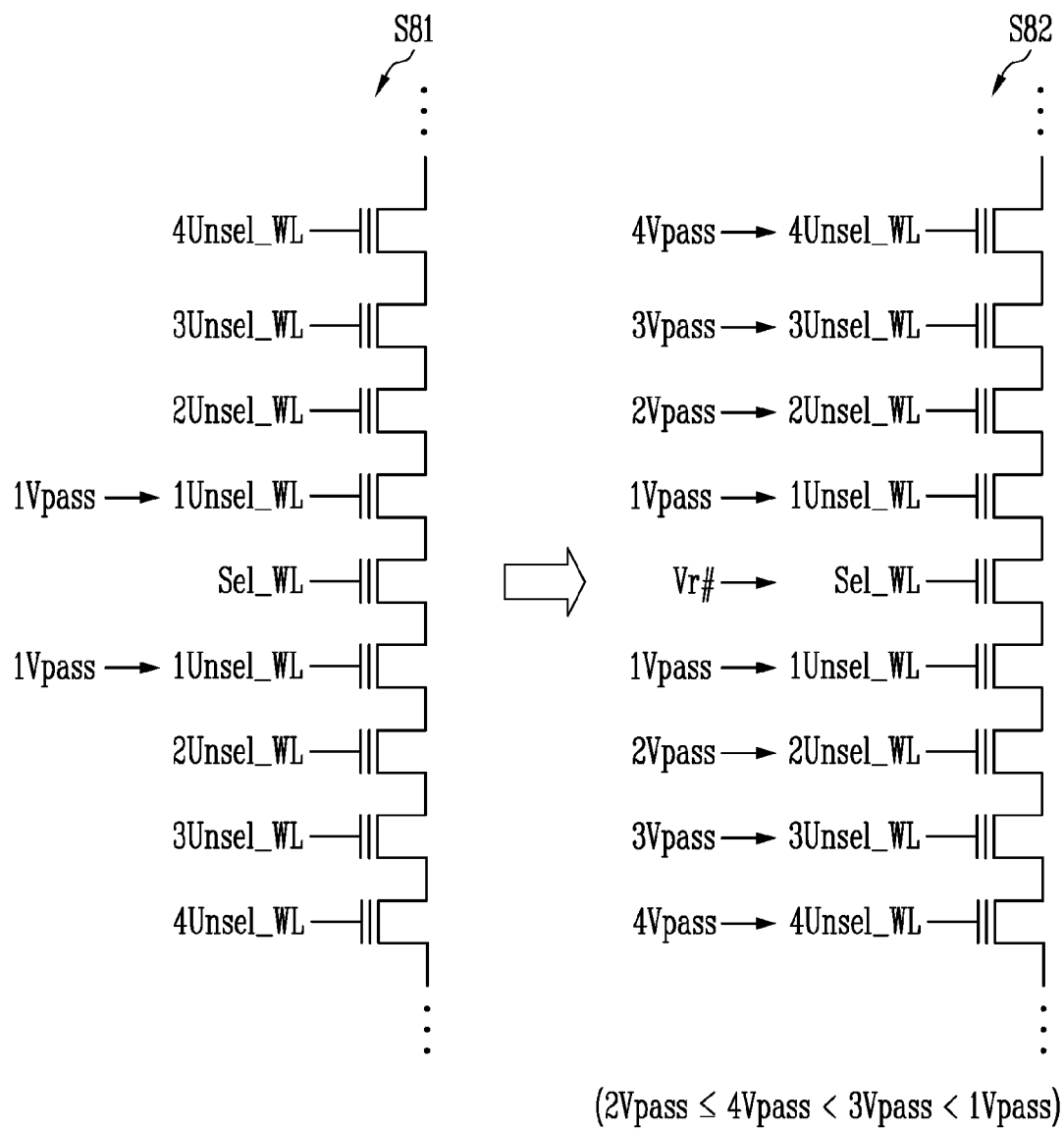
FIG. 9 is a diagram illustrating a sequence of the read operation according to the third embodiment of the present disclosure.

FIG. 9 is a diagram illustrating the sequence of the read operation according to the third embodiment of the present disclosure.

Referring to FIGS. 8 and 9, a first pass voltage 1Vpass, which is the highest pass voltage among pass voltages, may be applied to first unselected word lines 1Unsel_WL adjacent to the selected word line Sel_WL above and below the selected word line Sel_WL at step S81. In this case, the remaining lines other than the first unselected word lines 1Unsel_WL may float.

Then, a read voltage Vr #may be applied to the selected word line Sel_WL, and a second, third, or fourth pass voltage 2Vpass, 3Vpass or 4Vpass may be applied to the remaining second to fourth unselected word lines 2Unsel_WL to 4Unsel_WL at step S82. For example, the second pass voltage 2Vpass, which is the lowest pass voltage among the pass voltages, may be applied to the second unselected word lines 2Unsel_WL. The third pass voltage 3Vpass between the first and second pass voltages 1Vpass and 2Vpass may be applied to the third unselected word lines 3Unsel_WL. A fourth pass voltage 4Vpass, which is equal to or higher than the second pass voltage 2Vpass and lower than the third pass voltage 3Vpass, may be applied to the remaining unselected word lines.

Figure 10:
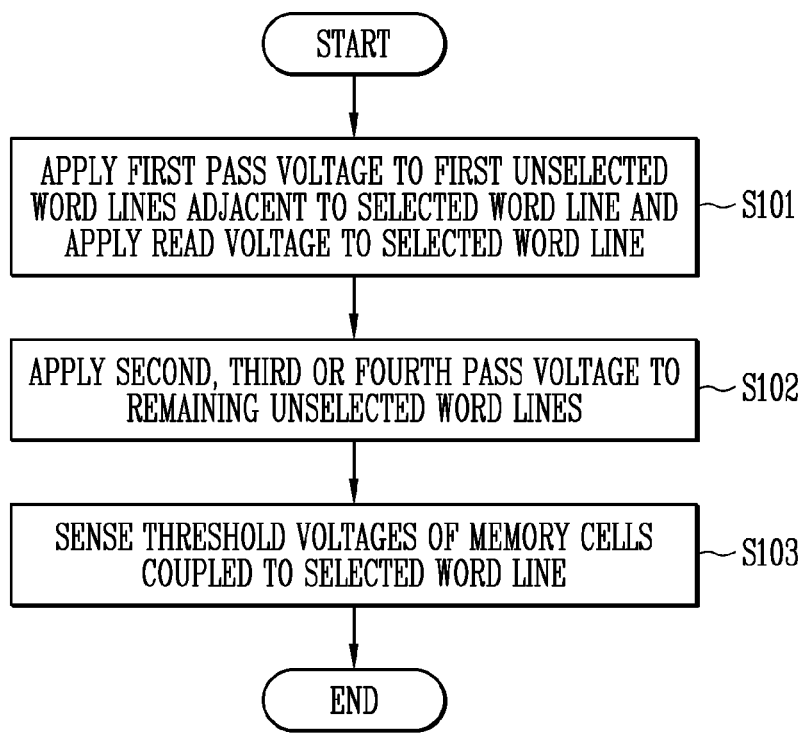
FIG. 10 is a diagram illustrating a read operation according to a fourth embodiment of the present disclosure.

FIG. 10 is a flowchart illustrating a read operation according to a fourth embodiment of the present disclosure.

Referring to FIG. 10, in the read operation according to the fourth embodiment, a read voltage may be applied to a selected word line while a first pass voltage is applied to first unselected word lines at step S101. Here, the remaining unselected word lines other than the first unselected word lines may float.

After the first pass voltage is applied to the first unselected word lines and the read voltage is applied to the selected word line at step S101, a second, third or fourth pass voltage may be applied to the remaining unselected word lines at step S102.

Thereafter, the threshold voltages of memory cells coupled to the selected word line may be sensed at step S103.

Figure 11:
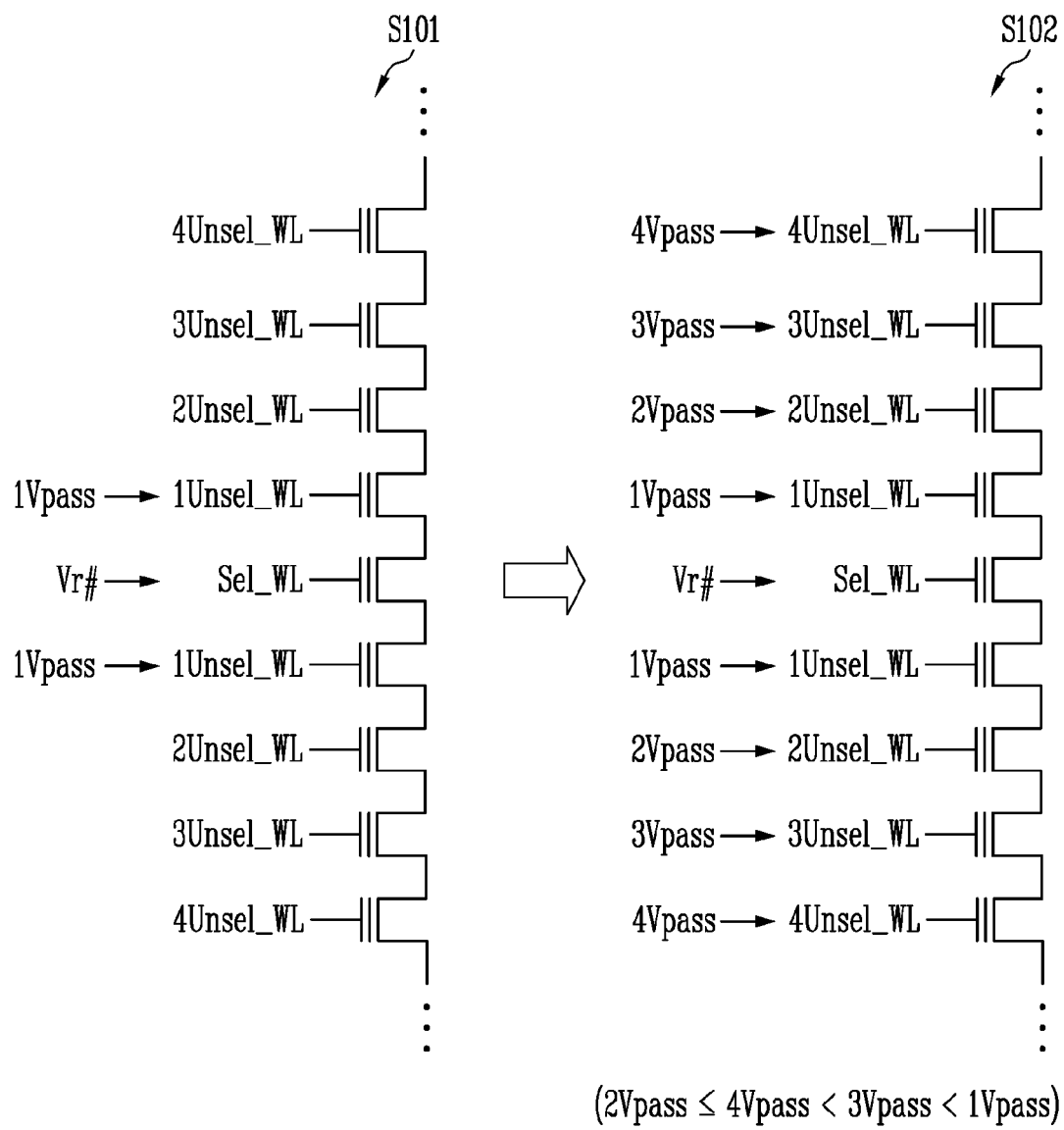
FIG. 11 is a diagram illustrating a sequence of the read operation according to the fourth embodiment of the present disclosure.

FIG. 11 is a diagram illustrating the sequence of the read operation according to the fourth embodiment of the present disclosure.

Referring to FIGS. 10 and 11, a read voltage Vr #may be applied to the selected word line Sel_WL, and a first pass voltage 1Vpass, which is the highest pass voltage among the pass voltages, may be applied to first unselected word lines 1Unsel_WL adjacent to the selected word line Sel_WL above and below the selected word line Sel_WL at step S101. In this case, the remaining lines, other than the selected word line Sel_WL and the first unselected word lines 1Unsel_WL, may float.

Then, the second, third, or fourth pass voltage 2Vpass, 3Vpass or 4Vpass may be applied to the second to fourth unselected word lines 2Unsel_WL to 4Unsel_WL at step S102. For example, the second pass voltage 2Vpass, which is the lowest pass voltage among the pass voltages, may be applied to the second unselected word lines 2Unsel_WL. The third pass voltage 3Vpass between the first and second pass voltages 1Vpass and 2Vpass may be applied to the third unselected word lines 3Unsel_WL. A fourth pass voltage 4Vpass, which is equal to or higher than the second pass voltage 2Vpass and lower than the third pass voltage 3Vpass, may be applied to the remaining unselected word lines.

Figure 12:
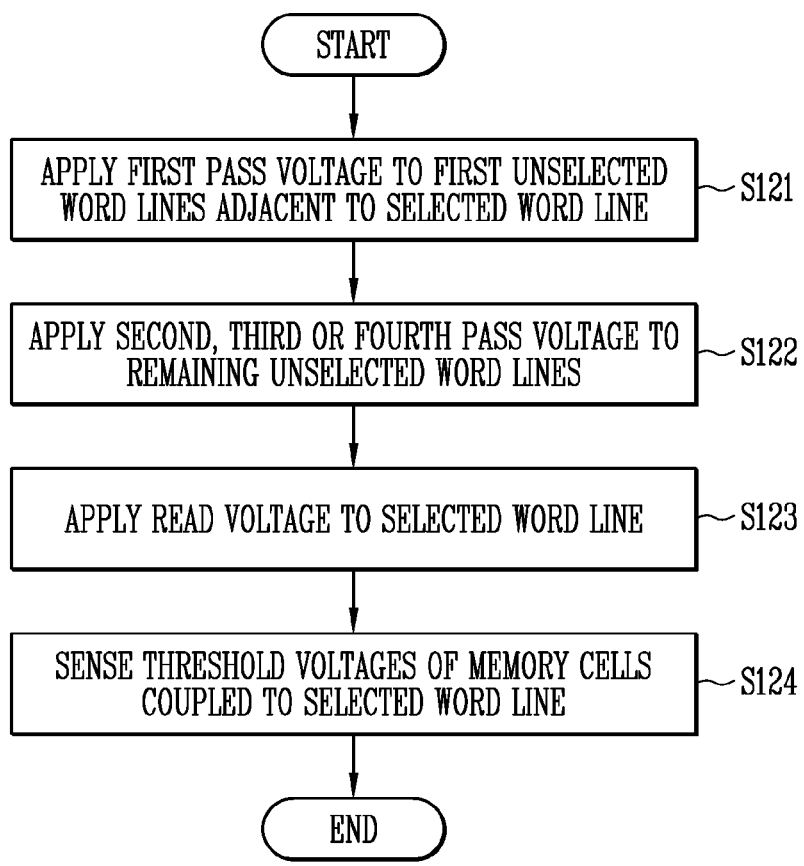
FIG. 12 is a flowchart illustrating a read operation according to a fifth embodiment of the present disclosure.

FIG. 12 is a flowchart illustrating a read operation according to a fifth embodiment of the present disclosure.

Referring to FIG. 12, in the read operation according to the fifth embodiment, a first pass voltage may be applied to first unselected word lines at step S121. Here, the remaining unselected word lines, other than the first unselected word lines, may float.

After the first pass voltage is applied to the first unselected word lines, a second, third or fourth pass voltage may be applied to the remaining unselected word lines at step S122. Thereafter, a read voltage may be applied to a selected word line at step S123, and threshold voltages of memory cells coupled to the selected word line may be sensed at step S124.

Figure 13:
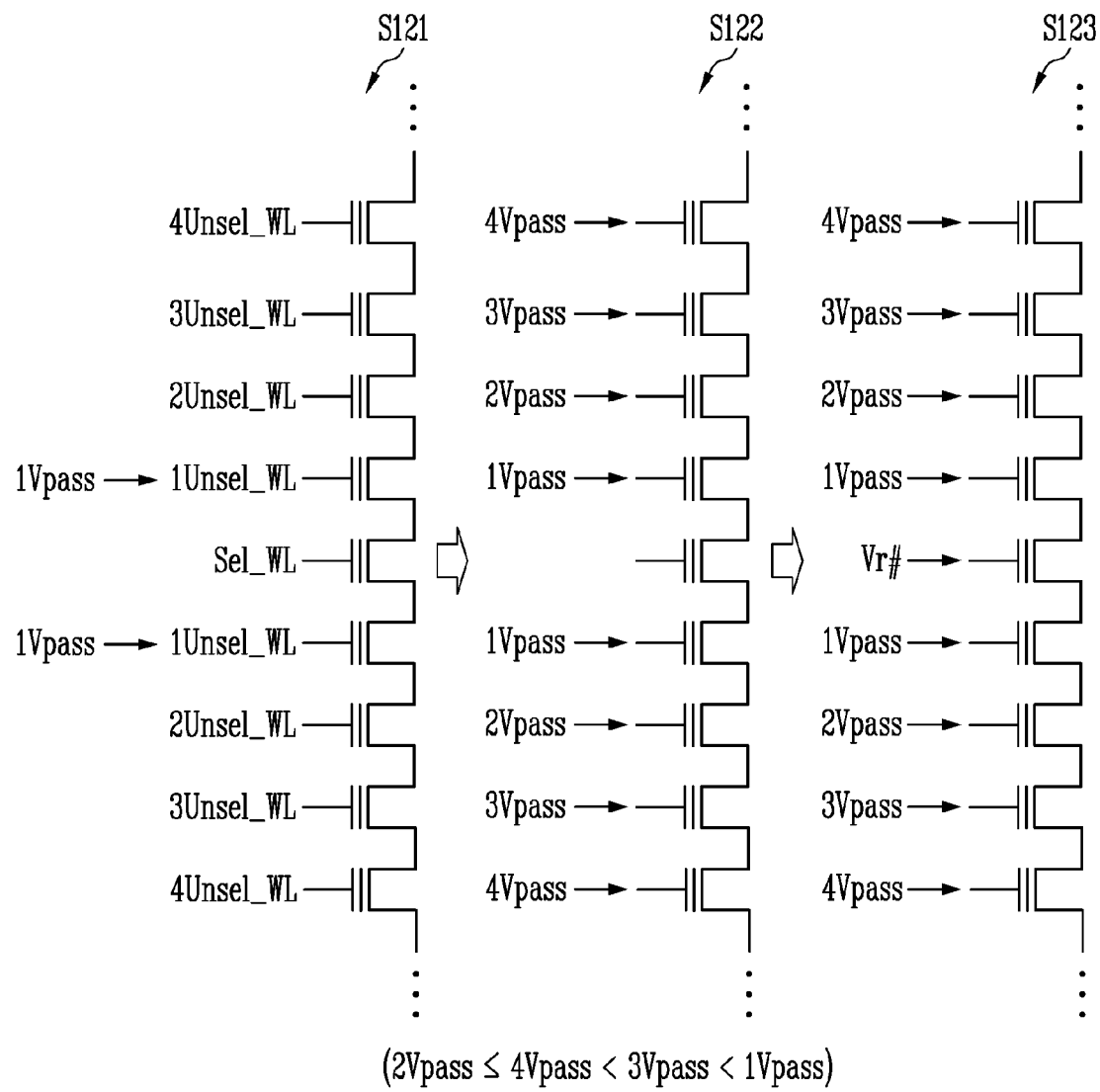
FIG. 13 is a diagram illustrating a sequence of the read operation according to the fifth embodiment of the present disclosure.

FIG. 13 is a diagram illustrating the order of the read operation according to the fifth embodiment of the present disclosure.

Referring to FIGS. 12 and 13, a first pass voltage 1Vpass, which is the highest pass voltage among pass voltages, may be applied to first unselected word lines 1Unsel_WL adjacent to the selected word line Sel_WL above and below the selected word line Sel_WL at step S121. In this case, the remaining lines other than the first unselected word lines 1Unsel_WL may float.

Then, the second, third, or fourth pass voltages 2Vpass, 3Vpass or 4Vpass may be applied to the remaining second to fourth unselected word lines 2Unsel_WL to 4Unsel_WL at step S122. When the pass voltages are applied to unselected word lines, a read voltage Vr #may be applied to a selected word line Sel_WL at step S123. For example, the second pass voltage 2Vpass, which is the lowest pass voltage among the pass voltages, may be applied to the second unselected word lines 2Unsel_WL. The third pass voltage 3Vpass between the first and second pass voltages 1Vpass and 2Vpass may be applied to the third unselected word lines 3Unsel_WL. A fourth pass voltage 4Vpass, which is equal to or higher than the second pass voltage 2Vpass and lower than the third pass voltage 3Vpass, may be applied to the remaining unselected word lines.

Figure 14:
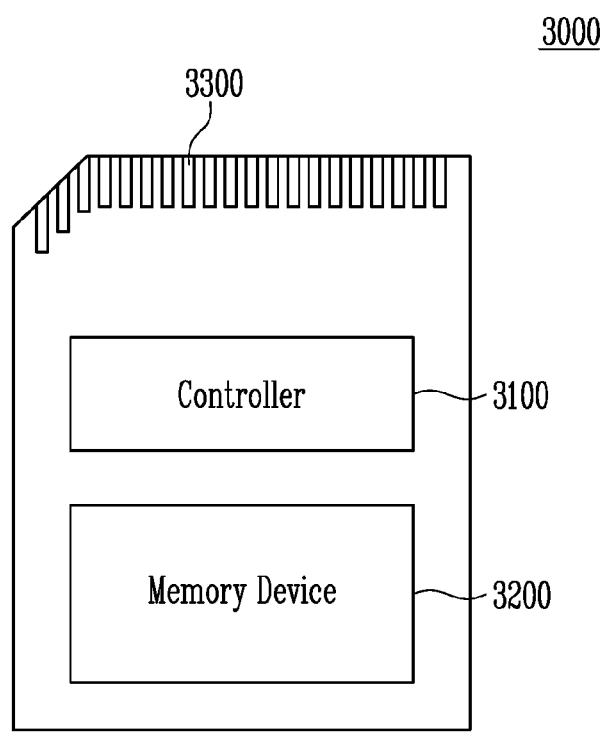
FIG. 14 is a diagram illustrating a memory card system to which a memory device according to the present disclosure is applied.

FIG. 14 is a diagram illustrating a memory card system to which a memory device according to the present disclosure is applied.

Referring to FIG. 14, a memory card system 3000 may include a controller 3100, a memory device 3200, and a connector 3300.

The controller 3100 may be coupled to the memory device 3200. The controller 3100 may access the memory device 3200. For example, the controller 3100 may control a program, a read, or an erase operation of the memory device 3200, or may control a background operation of the memory device 3200. The controller 3100 may provide an interface between the memory device 3200 and a host. The controller 3100 may run firmware for controlling the memory device 3200. In an example, the controller 3100 may include components, such as random access memory (RAM), a processor, a host interface, a memory interface, and an error correction block.

The controller 3100 may communicate with an external device through the connector 3300. The controller 3100 may communicate with an external device (e.g., a host) based on a specific communication standard. In an embodiment, the controller 3100 may communicate with the external device through at least one of various communication standards such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe). In an embodiment, the connector 3300 may be defined by at least one of the above-described various communication standards.

The memory device 3200 may include a plurality of memory cells, and may be configured in the same manner as the memory device 100 illustrated in FIG. 1. Therefore, the memory device 3200 may control pass voltages that are applied to unselected word lines during a read operation based on the above-described embodiments.

The controller 3100 and the memory device 3200 may be integrated into a single semiconductor device to form a memory card. For example, the controller 3100 and the memory device 3200 may be integrated into a single semiconductor device, and may then form a memory card such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 15:
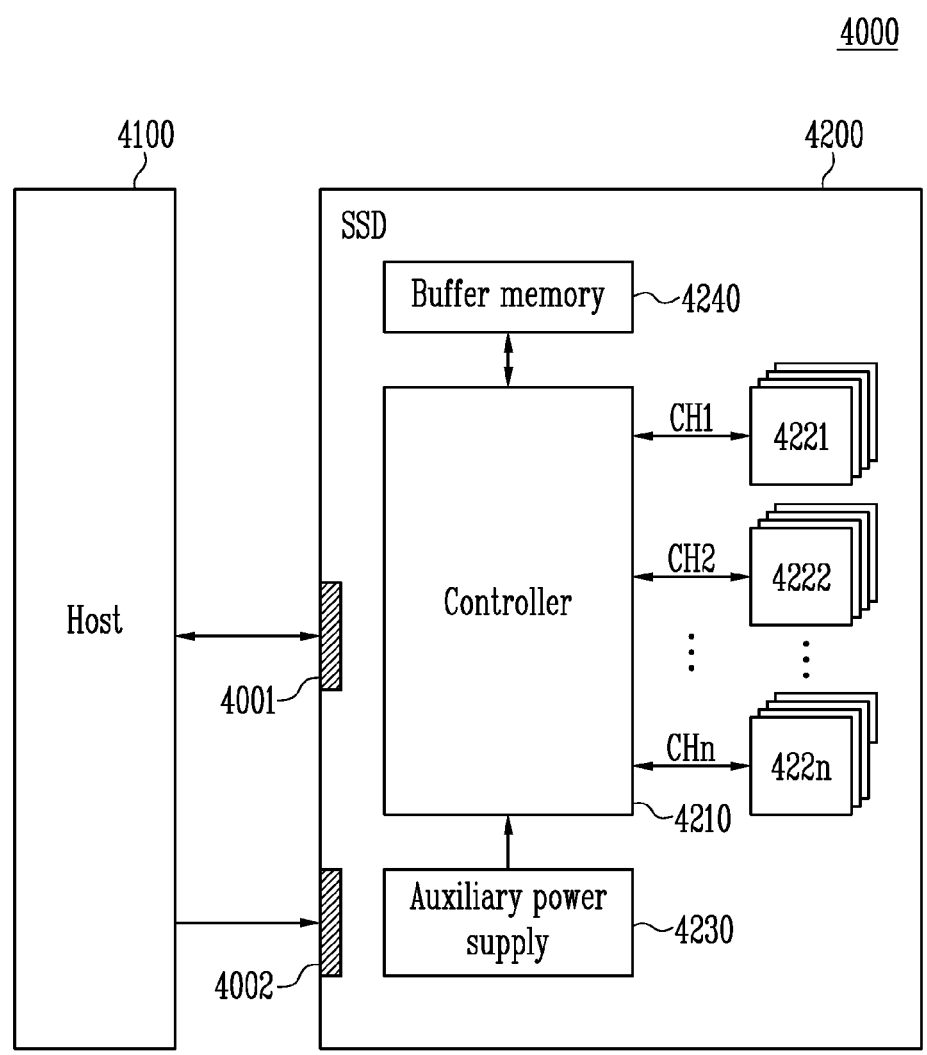
FIG. 15 is a diagram illustrating a solid state drive (SSD) system to which a memory device according to the present disclosure is applied.

FIG. 15 is a diagram illustrating a solid state drive (SSD) system to which a memory device according to the present disclosure is applied.

Referring to FIG. 15, an SSD system 4000 includes a host 4100 and an SSD 4200. The SSD 4200 may exchange signals with the host 4100 through a signal connector 4001, and may receive power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to signals received from the host 4100. In an embodiment, the received signals may be signals based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), firewire, universal serial flash storage (UFS), WiFi, Bluetooth, and nonvolatile memory express (NVMe).

Each of the plurality of memory devices 4221 to 422n may include a plurality of memory cells configured to store data. Each of the memory devices 4221 to 422n may be configured in the same manner as the memory device 100 illustrated in FIG. 1. Therefore, during a read operation, the plurality of memory devices 4221 to 422n may control the pass voltages to be applied to unselected word lines based on the above-described embodiments. The plurality of memory devices 4221 to 422n may communicate with the controller 4210 through channels CH1 to CHn.

The auxiliary power supply 4230 may be coupled to the host 4100 through the power connector 4002. The auxiliary power supply 4230 may be supplied with a supply voltage from the host 4100, and may be charged. The auxiliary power supply 4230 may provide the supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located on a main board, and may also provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422n, or may temporarily store metadata (e.g., mapping tables) of the memory devices 4221 to 422n. The buffer memory 4240 may include volatile memory, such as dynamic random access memory (DRAM), synchronous DRAM (SDRAM), double data rate (DDR) SDRAM, and low power DDR (LPDDR) SDRAM, or nonvolatile memory, such as ferroelectric RAM (FRAM), resistive RAM (ReRAM), spin transfer torque magnetic RAM (STT-MRAM), and phase-change RAM (PRAM).

The teachings of present disclosure may improve the reliability of a read operation performed on a memory device.

What is claimed is:

1. A memory device, comprising:
a memory block including memory cells; and
a voltage generator configured to apply a read voltage and pass voltages to word lines coupled to the memory block,
wherein the voltage generator is configured:
to apply a first pass voltage to first unselected word lines neighboring the selected word line,
to apply a second pass voltage, lower than the first pass voltage, to second unselected word lines neighboring the first unselected word lines; and
to apply a third pass voltage having a level between the first and second pass voltages to third unselected word lines neighboring the second unselected word lines.

2. The memory device according to claim 1, wherein the first pass voltage is a highest pass voltage among the pass voltages.

3. The memory device according to claim 2, wherein the second pass voltage is a lowest pass voltage among the pass voltages.

4. The memory device according to claim 1, wherein the voltage generator is configured to apply a fourth pass voltage that is equal to or higher than the second pass voltage and lower than the third pass voltage to remaining unselected word lines, other than the first, second, and third unselected word lines.

5. A memory device, comprising:
a memory block including memory cells; and
a voltage generator configured to apply a read voltage and pass voltages to word lines coupled to the memory block,
wherein the voltage generator is configured:
to apply a first pass voltage to first unselected word lines neighboring the selected word line,
to apply a second pass voltage, lower than the first pass voltage, to second unselected word lines neighboring the first unselected word lines and to third unselected word lines neighboring the second unselected word lines; and
to apply a third pass voltage having a level between the first and second pass voltages to fourth unselected word lines neighboring the third unselected word lines.

6. The memory device according to claim 1, wherein the voltage generator is configured to:

apply a first pass voltage among the pass voltages to first unselected word lines adjacent to the selected word line, and apply, after applying the first pass voltage, remaining pass voltages other than the first pass voltage to remaining unselected word lines other than the first unselected word lines.

7. The memory device according to claim 6, wherein the first pass voltage has a highest level among the pass voltages.

8. The memory device according to claim 6, wherein the voltage generator is configured to apply the read voltage to the selected word line while applying the remaining pass voltages to the remaining unselected word lines.

9. The memory device according to claim 6, wherein the voltage generator is configured to apply the read voltage to the selected word line while applying the first pass voltage to the first unselected word lines.

10. The memory device according to claim 6, wherein the voltage generator is configured to apply, after applying the remaining pass voltages to the remaining unselected word lines, the read voltage to the selected word line.

11. A method of operating a memory device, comprising:
applying a read voltage to a selected word line;
applying a first pass voltage to first unselected word lines adjacent to the selected word line;
applying a second pass voltage, lower than the first pass voltage, to second unselected word lines adjacent to the first unselected word lines; and applying a third pass voltage having a level between the first and second pass voltages to third unselected word lines adjacent to the second unselected word lines.

12. The method according to claim 11, wherein the first pass voltage is set to a highest level among pass voltages.

13. The method according to claim 11, wherein the second pass voltage is set to a lowest level among pass voltages.

14. The method according to claim 11, wherein applying the second pass voltage and applying the third pass voltage are performed after applying the first pass voltage.

15. The method according to claim 14, wherein applying the read voltage is performed while applying the first pass voltage is performed.

16. The method according to claim 14, wherein applying the read voltage is performed while applying the second pass voltage and applying the third pass voltage are performed.

17. The method according to claim 14, wherein applying the read voltage is performed after applying the second pass voltage and applying the third pass voltage.

18. The method according to claim 11, further comprising:
applying a fourth pass voltage to remaining unselected word lines other than the first, second, and third unselected word lines.

19. The method according to claim 18, wherein the fourth pass voltage is equal to or higher than the second pass voltage and lower than the third pass voltage.

* * * * *